United States Patent [19]

Milleker et al.

[11] 4,430,742
[45] Feb. 7, 1984

[54] DATA MUTING METHOD AND APPARATUS FOR RADIO COMMUNICATIONS SYSTEMS

[75] Inventors: William W. Milleker, Chicago; Thomas A. Freeburg, Arlington Heights; Michael A. Stepien, Hoffman Estates, all of Ill.

[73] Assignee: Motorola, Inc., Schaumburg, Ill.

[21] Appl. No.: 323,644

[22] Filed: Nov. 20, 1981

[51] Int. Cl.³ .............................................. H04Q 7/00
[52] U.S. Cl. .................................... 375/5; 375/104; 375/114; 455/38; 455/54; 340/825.44
[58] Field of Search ................ 179/2 E, 2 EA, 2 EB; 375/5, 104, 114, 115, 116; 455/31, 33, 35, 36, 38, 51, 53, 54, 58, 212, 218, 220, 221, 222, 224; 340/825.44, 311.1

[56] References Cited

U.S. PATENT DOCUMENTS

| | | | |
|---|---|---|---|
| 3,577,080 | 4/1971 | Cannalte | 325/183 |
| 3,758,860 | 9/1973 | Braun et al. | 325/18 |
| 3,906,445 | 9/1975 | Beckmann et al. | 340/146.1 BA |
| 3,939,431 | 2/1976 | Cohlman | 325/478 |
| 4,001,693 | 1/1977 | Stackhouse et al. | 455/51 |
| 4,020,421 | 4/1977 | Elder et al. | 375/5 |
| 4,131,849 | 12/1978 | Freeburg et al. | 325/54 |
| 4,156,867 | 5/1979 | Bench et al. | 340/146.1 AL |
| 4,197,502 | 4/1980 | Sumner et al. | 375/75 |
| 4,229,822 | 10/1980 | Bench | 375/81 |
| 4,233,565 | 11/1980 | Chmura | 329/50 |
| 4,344,175 | 8/1982 | Leslie | 455/218 |

FOREIGN PATENT DOCUMENTS 2004164  3/1979  United Kingdom .

OTHER PUBLICATIONS

"SMT-80 Status/Message Terminal," Motorola Equipment Catalog, Sheet R3-8.4-37, 1981.

"GCC-80 General Communications Controller", Motorola Equipment Catalog Sheet R3-8.4-41, 1981.

"SMT-80 Status/Message Terminal", Motorola Equipment Catalog Sheet RB-01-12, 1981.

Primary Examiner—Benedict V. Safourek
Attorney, Agent, or Firm—Rolland R. Hackbart; Edward M. Roney; James W. Gillman

[57] ABSTRACT

Data muting apparatus is described that mutes variable-length data signals communicated between a central station and mobile and portable radios in a dispatch radio communications system. The central station includes a base station transceiver, a dispatcher console, a general communications controller (GCC), a digital communications computer and a display terminal. The base station transmitter and receiver communicate over an RF duplex channel to the transceiver of the mobile and portable radios. The dispatcher console provides for voice communications and is coupled by a transmit signal line and a receive signal line to the base station transceiver. The GCC provides for data communications and is also coupled to the transmit signal line and is interposed between the dispatcher console and the base station transceiver in the receive signal line. The GCC and mobile and portable radios include data muting apparatus enbodying the present invention. The data muting apparatus includes a detector for detecting the presence of a carrier signal and muting circuitry for muting the transceiver output for a predetermined time interval when a carrier signal has been detected. During the predetermined time interval, other circuitry may detect a synchronization word in a received data signal and mute the receiver output until still other circuitry detects the last bit of a following information word in the received data signal and unmutes the transceiver output. Thus, data signals at the beginning of each communication are muted without impairing voice communications.

23 Claims, 7 Drawing Figures

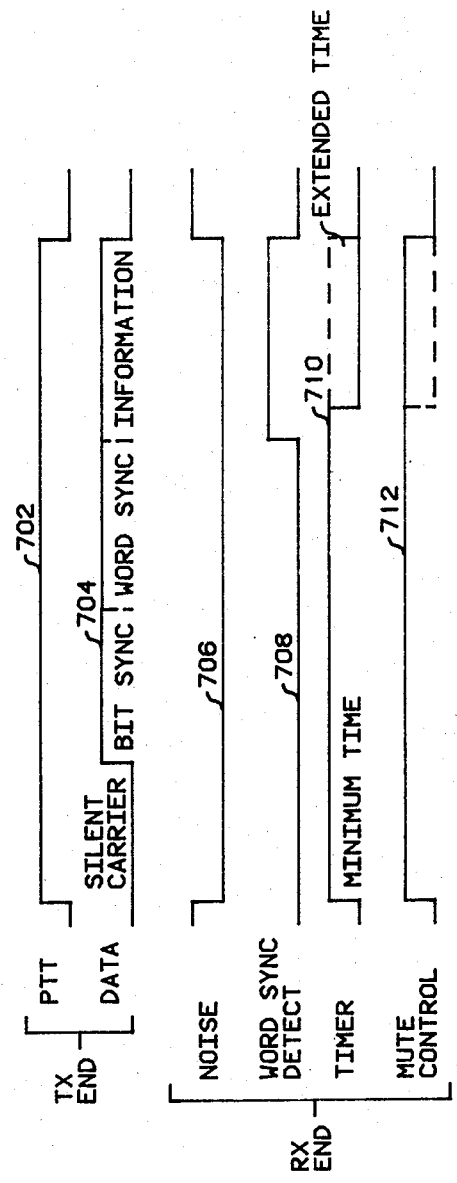

DATA MUTING METHOD AND APPARATUS FOR RADIO COMMUNICATIONS SYSTEMS

BACKGROUND OF THE INVENTION

The present invention is generally related to data muting techniques in voice communications systems, and more particularly to an improved data muting method and apparatus that is particularly well adapted for use in radio communications systems.

In the prior art, data muting in receivers of a voice communications systems typically has been accomplished by detecting the presence of a data signal and then muting the output of the receiver so that it is not heard. Many different techniques exist for detecting the presence of the data signal, such as, for example, those described in U.S. Pat. Nos. 3,758,860, 3,939,431, 4,197,502, 4,233,565 and 4,229,822. Since each of the foregoing prior art techniques requires the reception of several bits in order to detect the data signal, a short data burst is always passed to a listener. Since the peak-to-peak signal level of the data signal is very high for reliability reasons, the data bursts are very loud. During peak periods of data traffic in such communications systems, these data bursts are very annoying to a listener.

In receivers of other communications systems, the output of a receiver is muted for a fixed time period that is long enough to include the data signal. Since the fixed time period must be made long enough to accomodate system delays and the longest data signal, voice communications immediately following the data signal may also be muted. Therefore, there is a long felt need for a data muting method and apparatus that mutes the entire data signal without muting the following voice communications.

SUMMARY OF THE INVENTION

Accordingly, it is an object of the present invention to provide an improved data muting method and apparatus for voice communications systems that mutes data signals without impairing voice communications.

It is another object of the present invention to provide an improved data muting method and apparatus for voice communications systems that is responsive to variable length data signals for varying the duration of the muting.

It is yet another object of the present invention to provide an improved data muting method and apparatus for voice communications systems that provides a visual indication to the listener when a data signal is being muted.

In an embodiment of the present invention, apparatus is provided for muting the output of a receiver when a variable length data signal is being received. The variable length data signal may be preceded by or followed by analog or voice signals and is modulated onto a carrier signal. The data signal includes a synchronization word having a predetermined binary bit pattern followed by an information word having a preselected or varying number of binary bits. A detector is included in the muting apparatus for detecting the presence of the carrier signal. The output of the receiver is muted by muting circuitry for a predetermined time interval when the carrier signal has been detected by the carrier signal detector. During the the predetermined time interval, other circuitry may detect the synchronization word and mute the output of the receiver until still other circuitry detects the last bit of the information word and unmutes the output of the radio receiver. Thus, the output of the receiver is muted at a minimum for the predetermined time interval and at a maximum for a time interval ending with the last bit of the information word.

BRIEF DESCRIPTION OF THE DRAWINGS

FIG. 7 illustrates waveforms for the signals from selected blocks in FIG. 2.

DETAILED DESCRIPTION OF THE PREFERRED EMBODIMENTS

Figure 1:
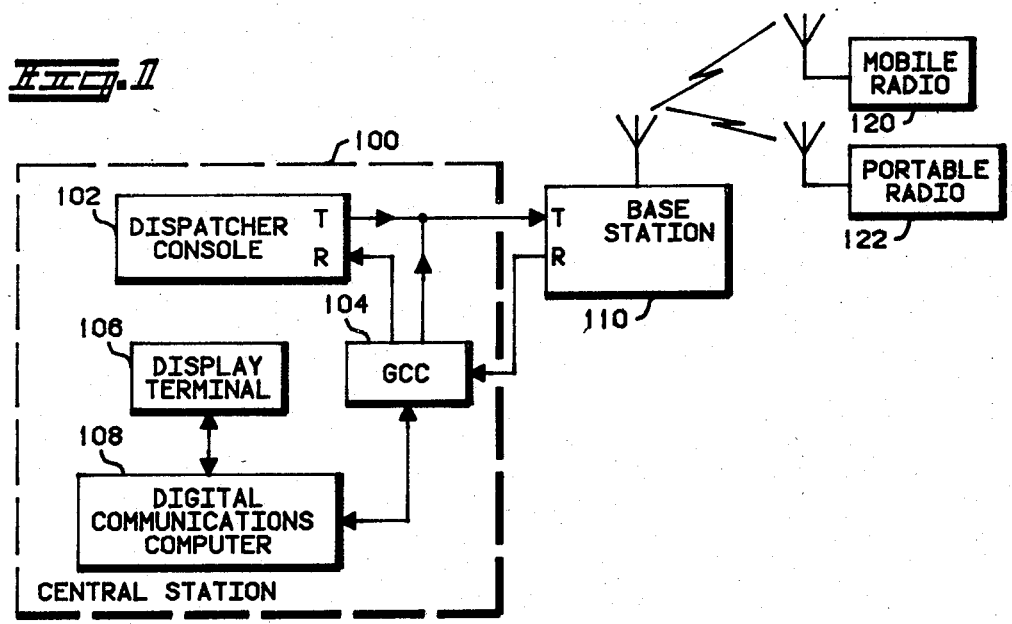
FIG. 1 is a block diagram of a radio communications system that may advantageously utilize muting apparatus embodying the present invention.

In FIG. 1, there is illustrated a radio communications system that communicates both data signals and voice signals between a dispatcher located in central station 100 and operators of mobile radios 120 and portable radios 122. The data and voice signals from central station 100 are coupled by wire lines, such as telephone lines, between central station 100 and base station 110. One or more base stations 110 each include a radio transmitter and receiver for communicating via a radio-frequency (RF) channel to mobile radios 120 and portable radios 122. Mobile and portable radios 120 and 122 may be any suitable conventional radio, such as, for example the frequency-modulated (FM) radio described in Motorola Instruction Manual 68P81043E40. Similarly, base station 110 may be any suitable conventional radio such as the FM radio described in Motorola Instruction Manual 68P81013E65. Both of these Motorola Instruction manuals and the others referenced hereinbelow are published by and available from the Service Publications Department of Motorola, Inc., 1301 E. Algonquin Road, Schaumburg, Ill.

Since base station 110 and central station 100 are not usually co-located, the operation of base station 110 is remotely controlled from central station 100 by means of a suitable remote control system, such as, for example, the tone remote control system described in U.S. Pat. No. 3,577,080. In such tone remote control systems, different frequency tone signals are used by the central station 100 for controlling the transmitter of base station 110, and other tone signals are used by the receiver of base station 110 for indicating when an RF carrier signal is being received from a mobile or portable radio 120 or 122.

Figure 5:
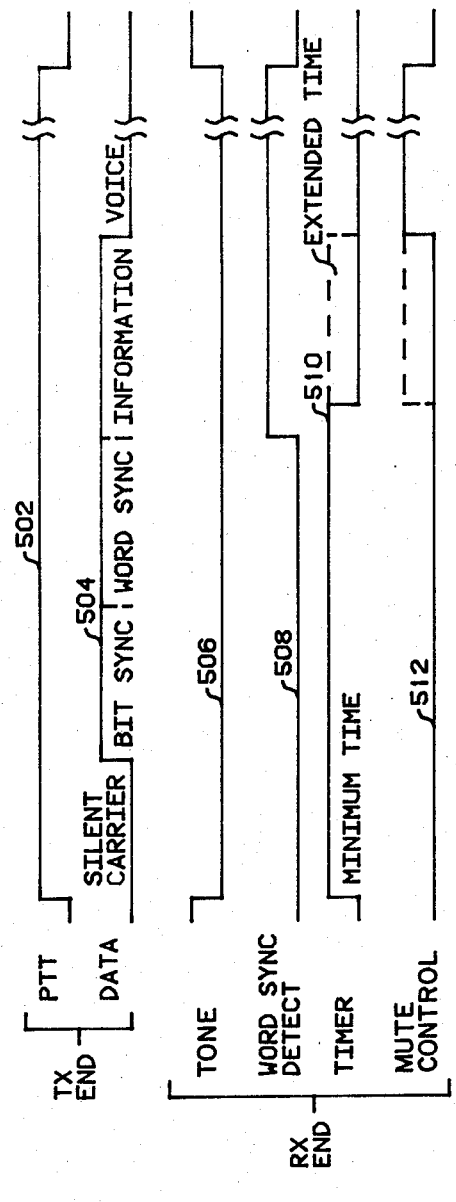
FIG. 5 illustrates waveforms for the signals from selected blocks in FIG. 3.

The data signals communicated between central station 100 and mobile and portable radios 120 and 122 include a bit synchronization portion, a synchronization word and an information word, as illustrated by waveform 504 in FIG. 5 and waveform 704 in FIG. 7. The bit synchronization portion may consist of a one-zero dotting pattern for allowing a receiver to attain clock synchronization. The synchronization word may consist of any suitable correlatable bit pattern, such as one of those described in United Kingdom patent application No. 2,004,164, published on Mar. 21, 1979. The information word may have a variable number of bits, consisting of a mobile or portable radio address, commands and/or status information. The information word may be arranged in any suitable format, such as, for example, the data formats described in U.S. Pat. Nos. 3,906,445, and 4,156,867.

Central station 100 includes a dispatcher remote control counsole 102 which may be of the type described in Motorola Instruction Manual 68P81015E55, a display terminal 106, a digital communications computer 108, and a general communications controller (GCC) 104. Voice communications with the mobile and portable radios 120 and 122 is established by means of the dispatcher counsole 102, while data communications are established by means of the display terminal 106, digital communications computer 108 and GCC 104. Both the dispatcher console 102 and GCC 104 control the RF transmitter at base station 110 by means of tone remote control, which is described in more detail in the aforementioned U.S. Pat. No. 3,577,080. All data signals are transmitted and received by GCC 104. Received data signals are coupled from GCC 104 to digital communications computer 108, which displays the status or message information contained in the received data signal on the display of display terminal 106. Data signals transmitted by GCC 104 may be entered from a keyboard of display terminal 106 or may be automatically generated by digital communications computer 108, as in the case of automatic acknowledgement signals. Display terminal 106 may be any conventional terminal including both a display and a keyboard. Digital communications computer 108 may be any suitable conventional computer, such as, for example, a Motorola type MC68000 computer (see the articles in "MC68000 Article Reprints", published by Motorola Semiconductor Products Inc., 3501 ED Bluestein Blvd., Austin, Tex., 1981), the details and programming of which are not essential to the data muting method and apparatus of the present invention.

The radio communications system in FIG. 1 is particularly well adapted for dispatch type applications, where a dispatcher at central station 100 communicates with the operators of a fleet of mobile and portable radios 120 and 122. In such dispatch radio communications systems, there may be one or more RF channels that are shared by several hundred mobile and portable radios 120 and 122. Therefore, it is desirable that some of the communications between the dispatcher at the central station 100 and the operators of the mobile and portable radios 120 and 122 be provided by means of data communications so that use of each RF channel is more efficient. If voice communications were required for every message, the RF channels would become extremely congested due to the large number of mobile and portable radios 120 and 122 allocated to each RF channel in such dispatch radio communications systems. Since both voice and data communications are present on the RF channel, the data muting method and apparatus of the present invention insure that only voice communications are heard by the dispatcher at the central station 100 and the operators of the mobile and portable radios 120 and 122. Thus, both the dispatcher and the mobile and portable radio operators are not annoyed by loud data bursts which occur frequently during peak data traffic periods.

Figure 2:
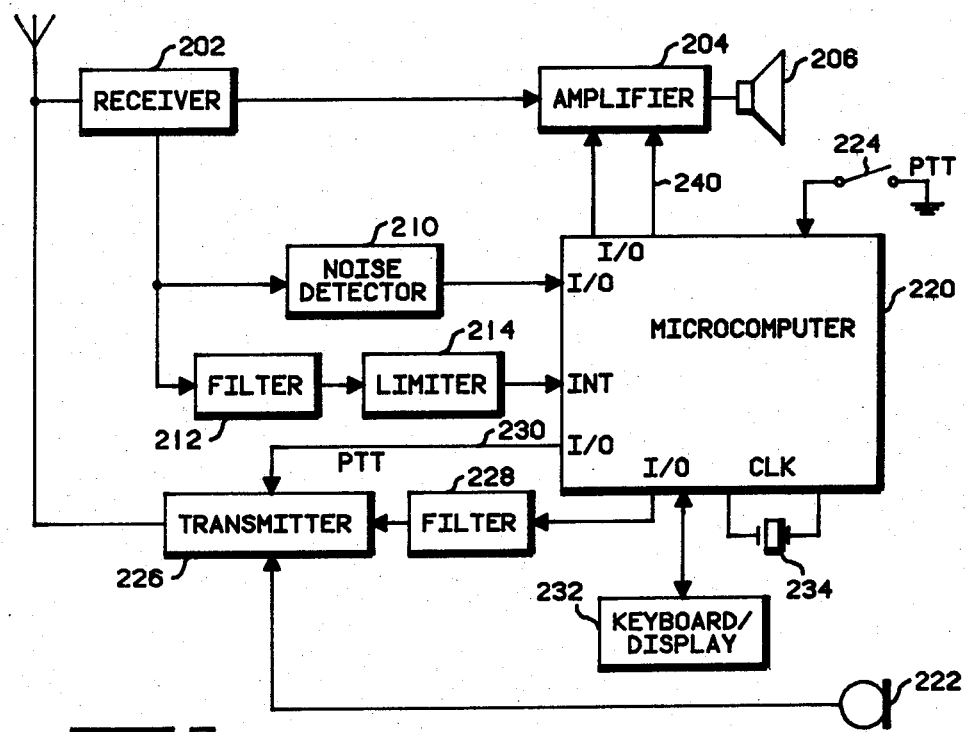
FIG. 2 is a block diagram of the mobile or portable radios in FIG. 1.

In FIG. 2, there is illustrated a block diagram of a mobile or portable radio embodying the data muting apparatus of the present invention. Each radio includes a microcomputer 220 which may be any suitable conventional microcomputer, such as, for example, a Motorola type MC6801 (described in detail in U.S. Pat. No. 4,266,270 and in the "MC6801 8-Bit Single-Chip Microcomputer Reference Manual", published by Motorola Microprocessor Operations, Motorola, Inc., Austin, Tex., 1980), for controlling the operation of RF receiver 202 and RF transmitter 226. The frequency of operation of microcomputer 220 is determined by crystal 234.

The discriminator output of receiver 202 is coupled to noise detector 210 which provides a noise signal indicating the presence or absence of an RF carrier signal, and is also coupled to filter 212 and limiter 214 for providing a non-return-to-zero (NRZ) signal which is coupled to the interrupt input of microcomputer 220. The data signals are preferably coded according to minimum-shift-keying (MSK) and transmitted at a nominal bit frequency of 1200 baud. Microcomputer 220 includes an MSK signal demodulator of the type described in co-pending U.S. patent application Ser. No. 290,276, invented by Richard A. Comroe and entitled "MSK and OK-QPSK Signal Demodulator", filed on Aug. 4, 1981 and assigned to the instant assignee. The MSK demodulator in microcomputer 220 is responsive the NRZ signal from limiter 214 for demodulating the MSK data signals transmitted by the central station and recovering the synchronization word and information word contained therein.

Microcomputer 220 continuously monitors the noise signal from noise detector 210 to determine when an RF carrier signal is present. When an RF carrier signal appears, microcomputer 220 mutes speaker 206 by means of the mute control signal 240, which reduces the gain of amplifier 204 by a predetermined amount, such as, for example, 30 dB. Alternatively, speaker 206 could be muted by means of an analog switch which opens and closes the signal path between amplifier 204 and speaker 206. In addition, microcomputer 220 may activate a light emitting diode in a display in keyboard/display module 232 for visually indicating to the operator of the radio that the received signal is being muted. The mute control signal 240 reduces the gain of amplifier 204 for a fixed time interval, which is extended by microcomputer 220 when the bit pattern of the synchronization word is detected. Once the last bit of the data signal has been detected, microcomputer 220 changes the state of the mute control signal 240 in order to return the gain of amplifier 204 for coupling the output from receiver 202 to speaker 206. After the data signal has passed, voice communications can take place between the radio operator and the dispatcher at the central station.

This operation of the mobile and portable radios is depicted by the waveforms in FIG. 7, where the transmit end waveforms 702 and 704 corresponds to signals at the GCC and the receiving end waveforms 706, 708, 710 and 712 corresponds to signals at the mobile and portable radios. The noise signal waveform 706 corresponds to the noise detect signal from noise detector 210 in FIG. 2, and the mute control signal waveform 712 corresponds to the mute control signal 240 provided by microcomputer 220 in FIG. 2. The word sync detect waveform 708 and timer waveform 710 corresponds to internal timing signals of microcomputer 220.

In the mobile and portable radios, voice communications are provided by means of speaker 206 and microphone 222. Whenever a mobile operator wishes to speak to the dispatcher at the central station, the push-to-talk (PTT) switch 224 is activated. Microcomputer 220 senses the activation of the PTT switch 224, and correspondingly enables transmitter 226 by means of PTT signal 230 and serially couples successive binary bits of a data signal to filter 228 for application to transmitter 226. The data signal transmitted by microcomputer 220 indicates to the dispatcher at the central station that a particular mobile desires to communicate with the dispatcher. The transmitted data signal is received by GCC 104 and coupled to digital communications computer 108 and thereafter displayed in the display of display terminal 106 in FIG. 1 for recognition by the dispatcher. The data signal transmitted by microcomputer 220 on the RF channel is received by the base station receiver and repeated by the base station transmitter so that other mobile and portable radios do not attempt to use the RF channel at the same time. The RF channel consists of two RF carrier frequencies, one RF carrier frequency for transmissions to the mobile and portable radios and one RF carrier frequency for transmissions to the base station.

Other digital messages are transmitted by microcomputer 220 in response to activation of keys in keyboard/display module 232. Each key in the keyboard/display module 232 can be assigned different functions depending on the requirements of a particular radio communications system, so that the status of these functions can be automatically sent to the dispatcher at the central station. Keyboard/display module 232 may also include a light-emitting-diode (LED) display for indicating to the mobile operator which function has been activated and relayed to the dispatcher at the central station. Other LED's in the keyboard/display module 232 may provide a mute indication when the speaker is muted, a ready indication when the radio has been powered up, an acknowledgement indication when the central station has acknowledged a data signal transmitted by microcomputer 220, a transmit indication that the radio is transmitting, and a call indication when the central station has sent a selective call to the mobile.

Figure 3:
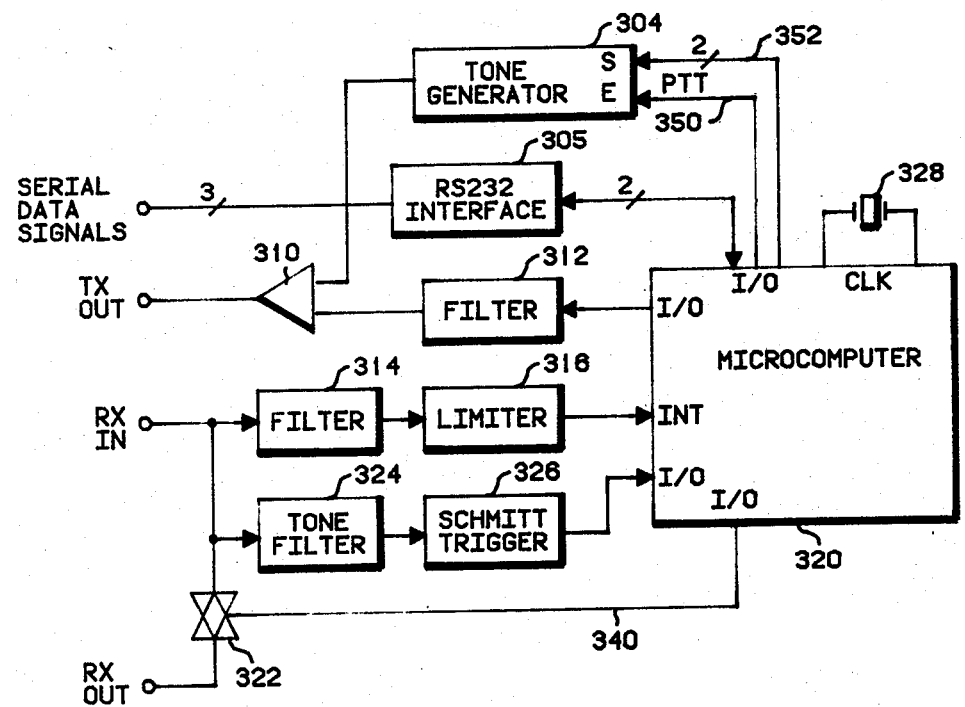
FIG. 3 is a block diagram of the general communications controller (GCC) in FIG. 1.

In FIG. 3, there is illustrated a block diagram of the GCC 104 in FIG. 1. The GCC is coupled to the transmit line between dispatcher console 102 and base station 110 in FIG. 1 and also is interposed between the dispatcher console 102 and base station 110 in the receive signal line, so that the GCC can mute the receive signal line when data signals are present. The GCC is also controlled by a conventional microcomputer 320, which likewise includes an MSK data demodulator of the type described in the aforementioned co-pending U.S. patent application Ser. No. 290,276. The frequency of operation of microcomputer 320 is determined by crystal 328. Microcomputer 320 is coupled to digital communications computer 108 in FIG. 1 by means of RS232 interface circuitry 305, which may be any conventional circuitry, such as, for example, the Motorola type MC1488 Line Driver and Motorola type MC1489 Line Receiver. Data signals generated by microcomputer 320 are coupled to filter 312 and thereafter to amplifier 310 for application to the transmit signal line. Since base station 110 in FIG. 1 is controlled by tone signals as described in the aforementioned U.S. Pat. No. 3,557,080, microcomputer 320 controls the transmitter of base station 110 by means of tone signals generated by tone generator 304, which tone signals are coupled to amplifier 310 for application to the transmit signal line. Microcomputer 320 enables tone generator 304 by means of PTT signal 350, and tone generator 304 generates the tone signal selected by tone select lines 352. The generated tone signals are coupled to the transmit signal line for controlling the RF transmitter of base station 110.

When an RF carrier signal is not being received by the base station receiver, a predetermined tone signal is coupled to the receive signal line, which tone signal is detected by tone filter 324 and Schmitt trigger 326 in FIG. 3. The tone detect signal from Schmitt trigger 326 is coupled to microcomputer 320. Thus, microcomputer 320 can sense the presence or absence of an RF carrier signal by means of the tone detect signal. If a tone is detected, an RF carrier signal is not being received, and if a tone is not detected, an RF carrier signal is being received.

The MSK demodulator in microcomputer 320 is responsive to the NRZ signal provided by filter 314 and responsive to the NRZ signal provided by filter 314 and limiter 316 at the interrupt input of microcomputer 320 for demodulating MSK data signals sent from mobile or portable radios. The GCC microcomputer 320 controls the muting of the receive line by means of mute gate 322. The mute control signal 340 from microcomputer 320 opens mute gate 322 for a predetermined time interval in response to the tone detect signal from Schmitt trigger 326. Upon detection of the synchronization word in a succeeding data signal, microcomputer 320 extends the time interval that the mute gate 322 is open until the last bit of the data signal has been detected. Once the last bit of the data signal has been detected, microcomputer 320 closes mute gate 322 for coupling following voice signals on the receive line from the base station receiver to the receive line coupled to dispatcher console 102 in FIG. 1.

This operation of the GCC microcomputer 320 in FIG. 3 is depicted by the waveforms in FIG. 5, where the transmit end waveforms 502 and 504 correspond to signals at the mobile or portable radio and the receiving end waveforms 506, 508, 510 and 512 correspond to signals at the GCC. The tone signal waveform 506 corresponds to the output of Schmitt trigger 326 in FIG. 3, and the mute control signal waveform 512 corresponds to the mute control signal 340 provided by microcomputer 320 in FIG. 3. The word sync detect waveform 508 and timer waveform 512 correspond to internal timing signals of microcomputer 320.

The waveforms of FIGS. 5 and 7 illustrate an important feature of the present invention, where the data muting is extended for a time duration sufficient to mute the entire data signal without muting following voice signals. That is, the timer waveforms 510 and 710 is extended until the end of the data waveforms 504 and 704, at which point the mute control signal waveforms 512 and 712 change state for unmuting the voice signal path. Thus, since muting is continued until the last bit of the information word is detected, the data muting apparatus of the present invention can accomodate data signals having a variable number of bits.

Figure 4:
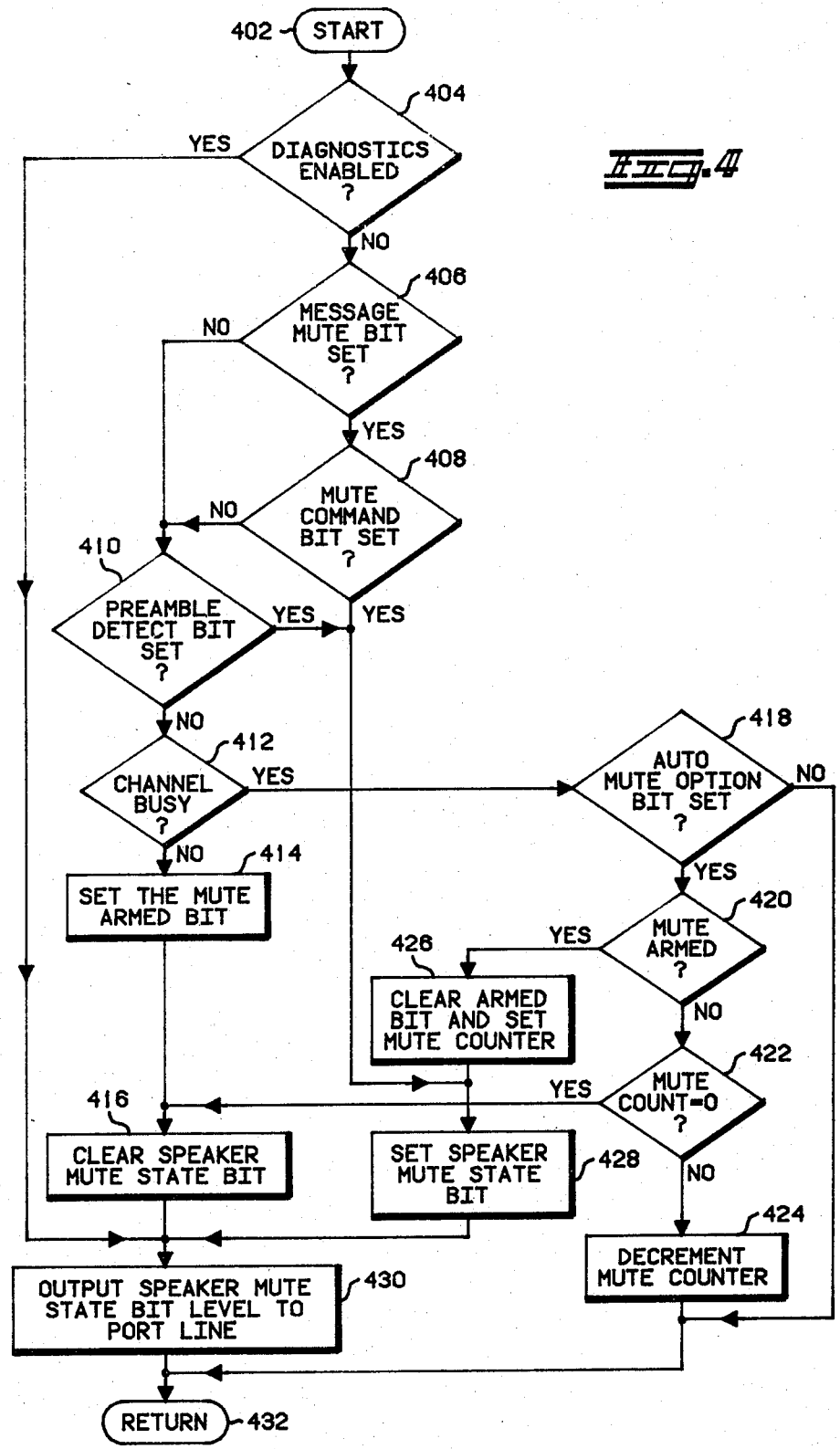
FIG. 4 is a flow chart illustrating an embodiment of the data muting method of the present invention.

Referring to FIG. 4, there is illustrated a flow chart embodying the data muting method of the present invention. The flow chart in FIG. 4 provides a detailed description of the process steps necessary for implementing the data muting method of the present invention in the radio microcomputer 220 in FIG. 2 and the GCC microcomputer 320 in FIG. 3. The description of the process steps of the flow chart in FIG. 4 will be described hereinbelow only with respect to the radio microcomputer 220. The coding of the process steps of the flow chart of FIG. 4 into the appropriate instructions of a suitable conventional microcomputer is a mere mechanical step for one skilled in the art. For example, a suitable program for implementation in a Motorola type MC6801 microcomputer is provided in the Appendix hereinbelow, wherein portions of the program corresponding to blocks in FIG. 4 are identified by the same reference number.

The flow chart in FIG. 4 is periodically executed by microcomputer 220 in FIG. 2. The flow chart is entered at start block 402 and proceeds to decision block 404, where it is determined whether or not diagnostics have been enabled. Diagnostics may typically be enabled when installing or adjusting the mobile or portable radio. If diagnostics are enabled, YES branch is taken from block 404 to block 420 and thereafter to return block 432. Normally, diagnostics are not enabled, so that NO branch is taken to decision block 406.

In decision block 406, it is determined whether or not the message mute bit is set. The message mute bit is set when muting of the speaker is to be controlled by command data signals from the central station. If the message mute bit is set, YES branch is taken to decision block 408, where it is determined whether or not the mute command bit is set. The binary state of the mute command bit is controlled by command data signals received from the central station. If the message mute bit is not set or if the mute command bit is not set, NO branches from decision blocks 406 and 408 lead to block 410.

In block 410, it is determined whether or not the preamble detect bit has been set. The preamble detect bit is set if the predetermined bit pattern of the synchronization word has been detected. If the mute command bit has been set of if the preamble detect bit has been set, YES branches from blocks 408 and 410 are taken to block 428. At block 428, the speaker mute state bit is set for muting the speaker. Otherwise, if the preamble detect bit has not been set, NO branch is taken to decision block 412 where it is determined whether or not the RF channel is busy. If the RF channel is not busy, NO branch is taken to block 414 where the mute armed bit is set, and thereafter to block 416 where the speaker mute state bit is cleared. The mute armed bit is set in preparation for muting of the next data signal to be transmitted by the base station. Also, the speaker mute state bit is cleared for unmuting the speaker. Next, at block 430, the new state of the speaker mute state bit is coupled to the mute control signal 240 at the output of microcomputer 220 in FIG. 2. Thereafter, program control returns at block 432.

If the RF channel is busy, YES branch is taken from block 412 to decision block 418 where it is determined whether or not the automatic mute option bit has been set. If the automatic mute option bit is set, speaker muting is preformed automatically by microcomputer 220. If the automatic mute option bit is not set, NO branch is taken to return block 432. Otherwise, YES branch is taken to decision block 420 where it is determined whether or not the mute armed bit is set. The mute armed bit is set at block 414 when the radio channel becomes non-busy after a previous communication. If the mute armed bit is set, YES branch is taken to block 426 where the mute armed bit is cleared and the mute counter is set to its initial state. The mute counter counts from its initial state to zero, at which time data muting is discontinued. If the synchronization word (preamble) is detected before the mute counter reaches zero, speaker muting will be extended until the end of the data signal since the YES branch will always be taken from block 410 to block 428. Next, at block 428, the speaker mute state bit is set in preparation for muting the speaker. The speaker mute state bit is then outputed to the mute control signal 240 in FIG. 2 at block 430, after which program control returns at block 432.

If the mute armed bit is not set, NO branch is taken from block 420 to decision block 422, where it is determined whether or not the mute counter has reached zero. If the mute counter has not reached zero, NO branch is taken to block 424 where the mute counter is decremented by one, afterwhich the program control returns at block 432. If the preamble is not detected and the mute counter has reached zero, YES branch is taken to block 416 where the speaker mute state bit is cleared for terminating data muting. Thereafter, program control returns by way of blocks 430 and 432 as explained hereinabove.

Summarizing the operations illustrated by the flow chart in FIG. 4, the speaker mute state bit is initially set in response to detection an RF carrier signal and is continued in response to detection of a synchronization word. The speaker mute state bit is cleared when the mute counter reaches a count of zero or when the end of the data signal is detected. Thus, the inventive data muting method of the present invention insures that the receive signal is muted only until the end of the data signal so as not to interrupt any of the following voice signals. The flow chart of FIG. 4 illustrates only one way of implementing the data muting method of the present invention. Many other ways of implementing the data muting method of the present invention can be devised by those skilled in the art without departing from the spirit and scope of the present invention.

Figure 6:
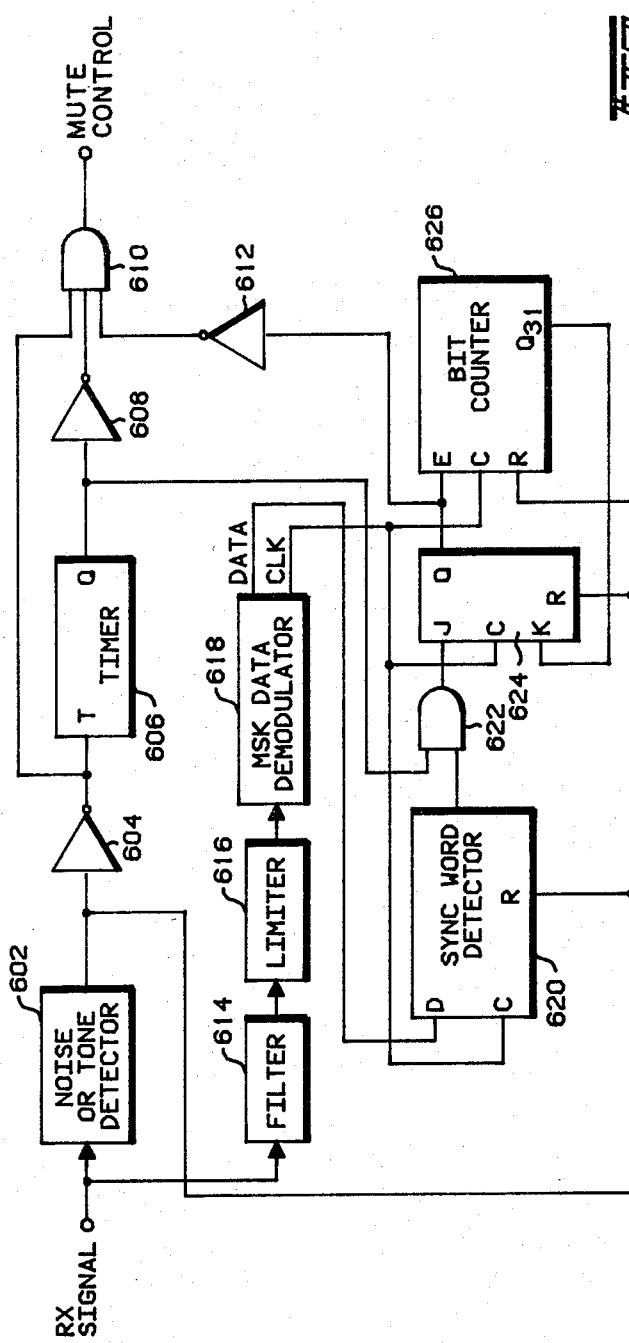
FIG. 6 is a block diagram of another embodiment of data muting apparatus embodying the present invention.

Referring to FIG. 6, there is illustrated a block diagram of another data muting apparatus embodying the present invention that may also be utilized in mobile and portable radios 120 and 122 and GCC 104 in FIG. 1. The data muting apparatus in FIG. 6 accepts the receive signal at its input and generates the mute control signal at its output. For GCC 104, the mute control signal is the output of AND gate 610, whereas for the mobile and portable radios, the mute control signal may be provided by a NAND gate coupled to the outputs of inverting gates 608 and 612. The receive signal is coupled to noise or tone detector 602 whose output indicates the presence or absence of a received signal (see waveform 506 in FIG. 5). The signal from noise or tone detector 602 is coupled by way of inverting gate 604 to the trigger input of timer 606. The output of timer 606 (see waveform 510 in FIG. 5) is triggered by the presence of a received signal and is coupled by way of inverting gate 608 to AND gate 610 for causing the mute control signal to have a binary zero state for a predetermined time interval. If a synchronization word is not detected during the time interval provided by the output of timer 606, the mute control signal provided by AND gate 610 will change state to a binary one state for enabling the receive signal path. Thus, the receive signal path is always muted for at least the time duration of the output of timer 606.

Assuming that the received signal includes a data signal, the received signal is also coupled to filter 614, whose output is coupled by limiter 616 to MSK demodulator 618. MSK demodulator 618 demodulates the data signal in the received signal to provide an NRZ data signal and a synchronized clock signal at its output. MSK demodulator may be suitable conventional circuitry, such as, for example, the demodulator described in the aforementioned U.S. Pat. No. 4,156,867. Synchronization word detector 620 is coupled to the outputs of MSK demodulator 618 and detects the presence of the synchronization word in the received signal. Synchronization word detector may be any suitable conventional circuitry, such as, for example, the detector described in the aforementioned U.K. patent application No. 2,004,164. The output of synchronization detector 620 is coupled to AND gate 622, whose output is coupled to the J input of flip-flop 624. The output of timer 606 is also coupled to AND gate 622. Thus, if the synchronization word is not detected by synchronization word detector 620 during the time interval provided by the output of timer 606, AND gate 622 will be disabled to prevent the output of flip-flop 624 from enabling bit counter 626. If the synchronization word is detected by synchronization word detector 620 during the time interval provided by the timer 606, the output of AND gate 622 couples a binary one state to the J input of flip-flop 624. At the next transition of the clock signal output from MSK demodulator 618, the output of flip-flop 624 is clocked to a binary one state for enabling bit counter 626. The output of flip-flop 624 is also coupled by way of inverting gate 612 to AND gate 610 for keeping the mute control signal in the binary zero state until the last bit of the data signal has been received. Once bit counter 626 has been enabled by the output of flip-flop 624, it counts the number of bits in the information word of the data signal (which is assumed to be 32) and provides an output during the last bit of the data signal. The output from bit counter 626 is coupled to the K input of flip-flop 624 and causes the output of flip-flop 624 to change state to a binary zero state. When the output of flip-flop 624 changes to a binary zero state, the mute control signal changes state to a binary one state for unmuting the received signal path (see waveform 512 in FIG. 5). Furthermore, the count at which bit counter 626 provides an output can be varied depending on the binary state of pre-selected bits of the received information word. All of the blocks of the data muting apparatus in FIG. 6 can be provided by conventional circuit elements.

In summary, an improved data muting method and apparatus has been described that eliminates the annoying data bursts caused by data signals in communications systems including both data and voice communications. The improved data muting method and apparatus mutes the signal received by a receiver for the duration of the data signal without muting following voice signals. Since the data muting is terminated when the last bit of the data signal has been detected, the improved data muting method and apparatus of the present invention can accommodate variable length data signals. The improved data muting method and apparatus can advantageously be used in radio or landline communications systems where both voice signals and data signals are communicated between a central station and a plurality of remote stations.

APPENDIX

Table I hereinbelow illustrates a suitable program for the flow chart in FIG. 4. The program is coded in mnemonic instructions for the Motorola type MC6801 microcomputer, which mnemonic instructions can be assembled into machine code instructions by a suitable assembler. The mnemonic instructions and operation of the Motorola type MC6801 microcomputer are described in further detail in the "MC6801 8-Bit Single-Chip Microcomputer Reference Manual", published by Motorola Microprocessor Operations, Motorola, Inc., Austin, Tex., 1980.

TABLE I

SPEAKER MUTING CONTROL ROUTINE

Location "TMRBYT"
B7 — Timer Overflow Service Request
B6 — Mute Armed Bit
B5 — Mute Command Bit
B4 — Speaker Mute State Bit
B3, B2, B1, B0 — Mute Counter

| Label | OP Code & Operand | Comments |
|---|---|---|
| 404 | LDAA EVENTF | ARE WE IN DIAGNOSTICS NOW? |
|  | BITA #DIAGMD |  |
|  | BNE 430 | BRANCH IF WE ARE. |
| 406 | LDAA TMRBYT |  |
|  | LDAB SYSTEM | IS THE MSG MUTE BIT SET? |
|  | BITB #00100000B |  |
|  | BEQ 410 | BRANCH IF IT ISN'T. |
| 408 | BTTA #00100000B | IS THE MUTE COMMAND BIT SET ? |
|  | BNE 428 | IF IT IS THEN MUTE SPEAKER. |
| 410 | LDAB CONTRL | IS THE PREAMBLE DETECT BIT SET? |
|  | BITB #10000000B |  |
|  | BEQ 412 | BRANCH IF IT ISN'T. |
|  | ANDA #$FO | CLEAR SPEAKER MUTE COUNTER. |
|  | BRA 428 |  |
| 412 | LDAB PARRAM | IS THE CHANNEL BUSY? |
|  | BTTB #CHNBSY |  |
|  | BNE 418 | IF IT IS THEN CHECK MUTE OPTION BIT. |
| 414 | ORAA #$40 | SET MUTE ARMED BIT. |
| 416 | ANDA #$EF | ELSE UNMUTE SPEAKER. |
|  | STAA TMRBYT |  |
|  | BRA 430 |  |
| 418 | LDAB SYSTEM | IS THE AUTO MUTE OPTION BIT SET? |

TABLE I-continued
SPEAKER MUTING CONTROL ROUTINE

Location "TMRBYT"
B7 — Timer Overflow Service Request
B6 — Mute Armed Bit
B5 — Mute Command Bit
B4 — Speaker Mute State Bit
B3, B2, B1, B0 — Mute Counter

| Label | OP Code & Operand | Comments |
|---|---|---|
|  | BITB #%10000000 |  |
|  | BEQ 432 | RETURN IF IT ISN'T. |
|  | BITA #$40 | IS THE MUTE ARMED NOW ? |
|  | BNE 426 | IF IT IS THEN DISARM. |
|  | TAB |  |
| 422 | ANDB #$0F | IS THE MUTE COUNTER = 0 |
|  | BEQ 416 | IF IT IS THEN UNMUTE SPEAKER. |
| 424 | DECA | DECREMENT COUNTER. |
|  | STAA TMRBYT | RESTORE THE CONTROL BYTE. |
|  | BRA 432 |  |
| 426 | ANDA #$B0 | CLEAR ARMED BIT. |
|  | ORAA MUTIME | SET MUTE COUNTER. |
| 428 | ORAA #$10 | SET SPEAKER MUTE STATE BIT. |
|  | STRAA TMRBYT |  |
| 430 | LDAA TMRBYT | OUTPUT SPEAKER MUTE STATE BIT TO PORT. |
|  | COMA | INVERT BIT. |
|  | ANDA #$10 | MASK OFF OTHER BITS. |
|  | LSRA | SHIFT INTO POSITION. |
|  | LSRA |  |
|  | LDAB PRT2IO | READ IN PORT. |
|  | ANDB #$FB | MASK OFF OLD SPEAKER MUTE STATE BIT. |
|  | ABA | ADD IN NEW SPEAKER MUTE STATE BIT. |
|  | STAA PRT2IO |  |
| 432 | RTS |  |

We claim:

1. Apparatus for muting the output of a receiver that receives a carrier signal modulated with a variable length data signal, the data signal including a synchronization word having a predetermined binary bit pattern followed by an information word having a variable number of binary bits, said muting apparatus comprising:

means for detecting the presence of the carrier signal;
means for muting the output of the receiver for a predetermined time interval when the carrier signal has been detected;
means for detecting the predetermined binary bit pattern of the synchronization word during the predetermined time interval and muting the output of the receiver when the predetermined binary bit pattern of the synchronization word has been detected; and
means for detecting the last bit of the information word and unmuting the output of the receiver when the last bit of the information word has been detected.

2. The apparatus according to claim 1, further including means for muting the output of the receiver when the carrier signal is absent.

3. The apparatus according to claim 1 or 2, further including means for providing an visual indication during the predetermined time interval that the output of the receiver is muted.

4. The apparatus according to claim 3, further including means for providing an visual indication that the carrier signal has been detected.

5. A method for muting the output of a receiver that receives a carrier signal modulated with a fixed length data signal, the data signal including a synchronization word having a predetermined binary bit pattern followed by an information word having a predetermined number of binary bits, said method comprising the steps of:

(a) detecting the presence of the carrier signal;
(b) muting the output of the receiver for a predetermined time interval when the carrier signal has been detected;
(c) detecting the predetermined binary bit pattern of the synchronization word during the predetermined time interval;
(d) muting the output of the receiver when the predetermined binary bit pattern of the synchronization word has been detected; and
(e) unmuting the output of the receiver for a time interval, substantially the same as the time duration of the information word, after the predetermined binary bit pattern of the synchronization word has been detected.

6. A method for muting the output of a receiver that receives a carrier signal modulated with a variable length data signal, the data signal including a synchronization word having a predetermined binary bit pattern followed by an information word having a variable number of binary bits, said method comprising the steps of:

(a) detecting the presence of the carrier signal;
(b) muting the output of the receiver for a predetermined time interval when the carrier signal has been detected;
(c) detecting the synchronization word during the predetermined time interval;
(d) muting the output of the receiver when the synchronization word has been detected;
(e) detecting the binary state of predetermined bits of the information word;
(f) selecting a predetermined number corresponding to the detected binary state of the predetermined bits of the information word; and (g) unmuting the output of the receiver after receiving the selected predetermined number of bits of the information word.

7. Apparatus for muting the output of a radio frequency (RF) receiver that receives an RF carrier signal modulated with a variable length data signal, the data signal including a synchronization word having a predetermined binary bit pattern followed by an information word having a variable number of binary bits, said muting apparatus comprising:
   means for detecting the presence of the RF carrier signal;
   means for muting the output of the receiver for a predetermined time interval when the RF carrier signal has been detected;
   means for detecting the predetermined binary bit pattern of the synchronization word during the predetermined time interval and muting the output of the receiver when the predetermined binary bit pattern of the synchronization word has been detected; and
   means for detecting the last bit of the information word and unmuting the output of the receiver when the last bit of the information word has been detected.

8. The apparatus according to claim 7, further including means for muting the output of the receiver when the RF carrier signal is absent.

9. Apparatus for attenuating the output of a speaker coupled by an amplifier, having a variable gain, to the output of a radio frequency (RF) receiver that receives an RF carrier signal modulated with a variable length data signal, the data signal including a synchronization word having a predetermined binary bit pattern followed by an information word having a variable number of binary bits, the receiver including squelch circuitry for attenuating the output of the speaker when the RF carrier signal is absent, said attenuating apparatus comprising:
   means for detecting the presence of the RF carrier signal;
   means for decreasing the gain of the amplifier by a predetermined amount for a predetermined time interval when the RF carrier signal has been detected;
   means for detecting the predetermined binary bit pattern of the synchronization word during the predetermined time interval and decreasing the gain of the amplifier by a predetermined amount when the predetermined binary bit pattern of the synchronization word has been detected; and
   means for detecting the last bit of the information word and increasing the gain of the amplifier by a predetermined amount when the last bit of the information word has been detected.

10. The apparatus according to claim 9, further including means for providing a visual indication during the predetermined time interval.

11. The apparatus according to claim 9 or 10, further including means for providing a visual indication that the RF carrier signal has been detected.

12. Apparatus for muting a speaker coupled to the output of a radio frequency (RF) receiver that receives an RF carrier signal modulated with a variable length data signal, the data signal including a synchronization word having a predetermined binary bit pattern followed by an information word having a variable number of binary bits, the receiver including squelch circuitry for muting the speaker when the RF carrier signal is absent, said muting apparatus comprising:
   means for detecting the presence of the RF carrier signal;
   means for muting the speaker for a predetermined time interval when the RF carrier signal has been detected;
   means for detecting the predetermined binary bit pattern of the synchronization word during the predetermined time interval and muting the speaker when the predetermined binary bit pattern of the synchronization word has been detected; and
   means for detecting the last bit of the information word and unmuting the speaker when the last bit of the information word has been detected.

13. The apparatus according to claim 12, further including means for providing a visual indication during the predetermined time interval.

14. The apparatus according to claim 12 or 13, further including means for providing a visual indication that the RF carrier signal has been detected.

15. A method for muting the output of a receiver that receives a carrier signal modulated with a variable length data signal, the data signal including a synchronization word having a predetermined binary bit pattern followed by an information word having the steps of:
   (a) detecting the presence of the carrier signal;
   (b) muting the output of the receiver for a predetermined time interval when the carrier signal has been detected;
   (c) detecting the predetermined binary bit pattern of the synchronization word during the predetermined time interval;
   (d) muting the output of the receiver when the predetermined binary bit pattern of the synchronization word has been detected;
   (e) detecting the last bit of the information word; and
   (f) unmuting the output of the receiver when the last bit of the information word has been detected.

16. The method according to claim 15, wherein said step (b) further includes the step of muting the output of the receiver when the carrier signal is absent.

17. A method for muting the output of a radio frequency (RF) receiver that receives an RF carrier signal modulated with a variable length data signal, the data signal including a synchjronization word having a predetermined binary bit pattern followed by an information word having a variable number of binary bits, said method comprising the steps of:
   (a) detecting the presence of the RF carrier signal;
   (b) muting the output of the receiver for a predetermined time interval when the RF carrier signal has been detected;
   (c) detecting the predetermined binary bit pattern of the synchronization word during the predetermined time interval;
   (d) muting the output of the receiver when the predetermined binary bit pattern of the synchronization word has been detected;
   (e) detecting the last bit of the information word; and
   (f) unmuting the output of the receiver when the last bit of the information word has been detected.

18. The method according to claim 17, wherein the step (b) further includes the step of muting the output of the receiver when the RF carrier signal is absent.

19. A system for muting data signals modulated on a radio frequency (RF) carrier signal communicated between a central station and at least one remote station, the data signal including a synchronization word having a predetermined binary bit pattern followed by an information word having a variable number of binary bits, the central station coupled by a transmit signal line to a base station RF transmitter and a receive signal line to a base station RF receiver, and the remote station including an RF receiver adapted to receive an RF carrier signal from the base station transmitter and an RF transmitter adapted to transmit an RF carrier signal to the base station receiver, said muting system comprising;

(a) at said central station, muting apparatus coupled to the receive signal line, said muting apparatus comprising:
  (i) means for detecting the presence of a received signal on the receive signal line;
  (ii) means for muting the receive signal line for a predetermined time interval when the received signal has been detected;
  (iii) means for detecting the predetermined binary bit pattern of the synchronization word during the predetermined time interval and muting the receive signal line when the predetermined binary bit pattern of the synchronization word has been detected; and
  (iv) means for detecting the last bit of the information word and unmuting the receive signal line when the last bit of the information word has been detected; and (b) at said remote station, muting apparatus coupled to the output of the receiver, and the output of the receiver further being coupled to a speaker, said muting apparatus comprising:
  (i) means for detecting the presence of a received signal on the output of the receiver;
  (ii) means for muting the speaker for a predetermined time interval when the received signal has been detected;
  (iii) means for detecting the predetermined binary bit pattern of the synchronization word during the predetermined time interval and muting the speaker when the predetermined binary bit pattern of the synchronization word has been detected; and
  (iv) means for detecting the last bit of the information word and unmuting the speaker when the last bit of the information word has been detected.

20. The apparatus according to claim 19, wherein said remote station muting apparatus further includes means for providing a visual indication during the predetermined time interval.

21. The apparatus according to claim 19 or 20, wherein said remote station muting apparatus further includes means for providing a visual indication that the received signal has been detected.

22. A method for muting the output of a receiver that receives a carrier signal modulated with a variable length data signal, the data signal including a synchronization word having a predetermined binary bit pattern followed by an information word having a variable number of binary bits, said method comprising the steps of:
  (a) detecting the presence of the carrier signal;
  (b) muting the output of the receiver for a predetermined time interval when the carrier signal has been detected;
  (c) detecting the synchronization word during the predetermined time interval;
  (d) muting the output of the receiver when the synchronization word has been detected;
  (e) detecting a pre-selected bit pattern in the bits of the information word; and
  (f) unmuting the output of the receiver when the the pre-selected bit pattern in the bits of the information word has been detected.

23. A method for muting the output of a radio frequency (RF) receiver that receives an RF carrier signal modulated with a variable length data signal, the data signal including a synchronization word having a predetermined binary bit pattern followed by an information word having a variable number of binary bits, said method comprising the steps of:
  (a) detecting the presence of the RF carrier signal;
  (b) generating a predetermined time interval when the RF carrier has been detected;
  (c) muting the output of the receiver for the generated predetermined time interval;
  (d) detecting the predetermined binary bit pattern of synchronization word;
  (e) terminating the generated predetermined time interval and muting the output of the receiver when the predetermined binary bit pattern of the synchronization word has been detected;
  (f) detecting the last bit of the information word; and
  (g) unmuting the output of the receiver when the last bit of the information word has been detected.

* * * * *

UNITED STATES PATENT AND TRADEMARK OFFICE
CERTIFICATE OF CORRECTION

PATENT NO. : 4,430,742

DATED : February 7, 1984

INVENTOR(S) : William W. Milleker, Thomas A. Freeburg and Michael A. Stepien

It is certified that error appears in the above—identified patent and that said Letters Patent is hereby corrected as shown below:

In column 14, line 26, after "having" insert --a variable number of binary bits, said method comprising--

In column 14, line 46, delete "synchjronization" and insert --synchronization--

Signed and Sealed this

Ninth Day of October 1984

[SEAL]

Attest:

Attesting Officer

GERALD J. MOSSINGHOFF

Commissioner of Patents and Trademarks